United States Patent
Kim et al.

(10) Patent No.: US 11,121,082 B2
(45) Date of Patent: Sep. 14, 2021

(54) SUB-GROUND RULE E-FUSE STRUCTURE

(71) Applicant: INTERNATIONAL BUSINESS MACHINES CORPORATION, Armonk, NY (US)

(72) Inventors: Andrew T. Kim, Orangevale, CA (US); Baozhen Li, South Burlington, VT (US); Chih-Chao Yang, Glenmont, NY (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/387,481

(22) Filed: Apr. 17, 2019

(65) Prior Publication Data
US 2020/0335440 A1  Oct. 22, 2020

(51) Int. Cl.
*H01L 23/525*  (2006.01)
(52) U.S. Cl.
CPC ............................. *H01L 23/5256* (2013.01)
(58) Field of Classification Search
CPC .......................... H01L 23/5256; H01L 23/62
See application file for complete search history.

(56) References Cited

U.S. PATENT DOCUMENTS

| | | |
|---|---|---|
| 4,227,168 A | 10/1980 | Knapp, Jr. |
| 4,228,417 A | 10/1980 | Belcher |
| 4,240,058 A | 12/1980 | Belcher |
| 4,245,208 A | 1/1981 | Belcher |
| 4,254,394 A | 3/1981 | Kozacka |
| 4,272,752 A | 6/1981 | Jacobs, Jr. |
| 4,306,212 A | 12/1981 | Belcher |
| 6,300,233 B1 | 10/2001 | Lee et al. |
| 6,664,141 B1 | 12/2003 | Castagnetti et al. |
| 6,754,135 B2 | 6/2004 | Pilo |
| 6,897,543 B1 | 5/2005 | Huang et al. |
| 6,998,865 B2 | 2/2006 | Bard et al. |
| 7,157,782 B1 | 1/2007 | Shih et al. |
| 7,272,067 B1 | 9/2007 | Huang |
| 8,629,050 B2 | 1/2014 | Thei et al. |
| 9,685,404 B2 | 6/2017 | Junjing |
| 2009/0243032 A1 | 10/2009 | Chen |
| 2010/0032797 A1 | 2/2010 | Takenaki |
| 2012/0126363 A1 | 5/2012 | Wang et al. |
| 2015/0228436 A1 | 8/2015 | Ungar et al. |
| 2015/0243578 A1 | 8/2015 | Botula et al. |

(Continued)

OTHER PUBLICATIONS

Elodie Ebrard et al., "Review of fuse and antifuse solutions for advanced standard CMOS technologies", Microelectronics Journal, vol. 40, pp. 1755-1765, 2009.

*Primary Examiner* — Matthew E. Gordon
(74) *Attorney, Agent, or Firm* — L. Jeffrey Kelly

(57) ABSTRACT

An e-Fuse device including a first electronic feature and a second electronic feature comprised of a conductive material, each of the first electronic feature and the second electronic feature having a width at least as great as a ground rule of a patterning process; and a fuse element comprised of the conductive material having a width less than the ground rule of the patterning process, the fuse element connecting a bottom portion of the first electronic feature and a bottom portion of the second electronic feature. Also disclosed is a method of making the e-Fuse device.

11 Claims, 14 Drawing Sheets

(56) References Cited

U.S. PATENT DOCUMENTS

| | | | |
|---|---|---|---|
| 2016/0079166 A1 | 3/2016 | Farooq et al. | |
| 2017/0018499 A1* | 1/2017 | Chen | H01L 23/5283 |
| 2018/0323067 A1* | 11/2018 | Shu | H01L 23/5256 |
| 2019/0326209 A1* | 10/2019 | Shu | H01L 21/76816 |
| 2020/0126911 A1* | 4/2020 | Li | H01L 21/76882 |

* cited by examiner

SUB-GROUND RULE E-FUSE STRUCTURE

BACKGROUND OF THE INVENTION

This disclosure relates to integrated circuit devices. More specifically, it relates to a method and structure to create e-Fuse structures in semiconductor devices with advanced metallization.

As the dimensions of modern integrated circuitry in semiconductor chips continue to shrink, conventional lithography is increasingly challenged to make smaller and smaller structures.

E-Fuses, or simply fuses or fuse structures, are utilized within integrated circuit devices for a variety of purposes, such as programming certain functionality into the device or to enable or disable various devices within the circuit device. Such fuse structures can break electrical connections (such as in physically destroyable fuses or anti-fuses). As the dimensions of the circuitry become ever smaller, it is desirable to reduce the power needed to program integrated circuits. Yet with advanced metallurgy, metals other than copper are used to form the interconnecting metallurgy in which the e-Fuses are also formed. These metals have higher melting points and excellent electromigration (EM) resistance which require higher programming power rather than lower programming power.

Also, advanced patterning processes, such as self-aligned double patterning (SADP) and self-aligned quadruple patterning (SAQP), have layout limitations which make traditional fuse shapes with a relatively narrower fuse element and wider contact portions difficult to fabricate.

BRIEF SUMMARY

The various advantages and purposes of the exemplary embodiments as described above and hereafter are achieved by providing, according to an aspect of the exemplary embodiments, a method for making an e-Fuse device comprising: forming a mandrel structure over a dielectric; patterning the mandrel structure to include a first portion, a second portion and a third portion connecting the first portion and the second portion, the third portion having a dimension that is less than a minimum ground rule; forming a sidewall layer over the mandrel structure so that sidewalls are formed in a sidewall pattern on sidewalls of the mandrel structure; removing the mandrel structure and using the sidewall pattern to etch the dielectric to form a trench structure comprising a first electronic feature replacing the first portion of the mandrel structure and having a width at least as great as a ground rule of the patterning process for the first electronic feature, a second electronic feature replacing the second portion of the mandrel structure having a width at least as great as a ground rule of the patterning process for the second electronic feature and a fuse element trench having a width less than the minimum ground rule replacing the third portion of the mandrel structure; and filling the trenches with conductive material to form electronic features and a fuse element having a width less than the minimum ground rule.

According to another aspect of the exemplary embodiments, there is provided an e-Fuse device comprising: a first electronic feature and a second electronic feature comprised of a conductive material, each of the first electronic feature and the second electronic feature having a width at least as great as a ground rule of a patterning process; and a fuse element comprised of the conductive material having a width less than the ground rule of the patterning process, the fuse element connecting a bottom portion of the first electronic feature and a bottom portion of the second electronic feature.

According to a further aspect of the exemplary embodiments, there is provided an e-Fuse device comprising: a first electronic feature and a second electronic feature comprised of a conductive material, each of the first electronic feature and the second electronic feature having a width at least as great as a ground rule of a patterning process; and a fuse element comprised of the conductive material having a width less than the ground rule of the patterning process, the fuse element connecting a bottom portion of the first electronic feature and a bottom portion of the second electronic feature, the first electronic feature, the second electronic feature and the fuse element are connected such that the fuse element is aligned with an edge of the first electronic feature and an edge of the second electronic feature.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A-6A, 1B to 6B and 6C illustrate one exemplary embodiment in which each "A" Figure is a top down view and each "B" Figure is a cross-section view along the line B-B in FIG. 1A and the "C" Figure is an enlarged portion of the FIG. 6B wherein:

FIGS. 1A and 1B illustrate a substrate having a dielectric layer, hard mask layer and mandrel layer and cut masks positioned over one part of the mandrel layer to cut the mandrel;

FIGS. 6A and 6B illustrate the substrate in FIGS. 5A and 5B in which the hard mask layer has been used to etch the dielectric layer, the hard mask layer is removed and metal fill is deposited to form electronic features and a sub-ground rule fuse element connecting two electronic features; and FIG. 6C is an enlarged view of FIG. 6B focusing on the sub-ground rule fuse element.

FIGS. 7A-12A, 7B to 12B and 12C illustrate another exemplary embodiment in which each "A" Figure is a top down view and each "B" Figure is a cross-section view along the line B-B in FIG. 7A and the 12C Figure is an enlarged portion of FIG. 12B wherein:

FIGS. 7A and 7B illustrate a substrate having a dielectric layer, hard mask layer and mandrel layer and cut masks positioned over one part of the mandrel layer to cut the mandrel;

FIGS. 12A and 12B illustrate the substrate in FIGS. 11A and 11B in which the hard mask layer has been used to etch the dielectric layer, the hard mask layer is removed and metal fill is deposited to form electronic features and a sub-ground rule fuse element and two sub-ground rule heat blocking end links; and FIG. 12C is an enlarged view of FIG. 12B focusing on the sub-ground rule fuse element.

DETAILED DESCRIPTION

Figure 1A:
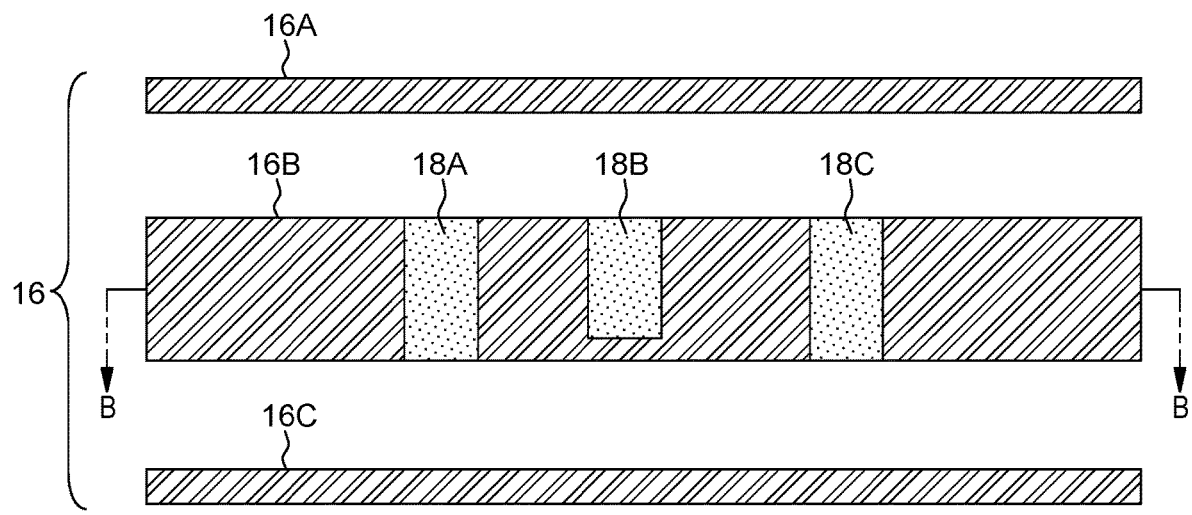
Figure 1B:
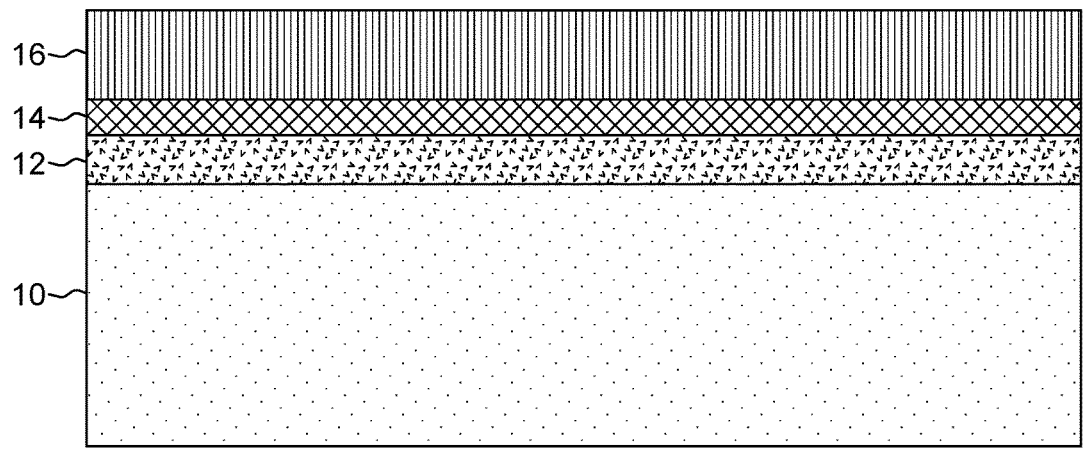

At a high level, the invention includes an e-Fuse structure and a method for fabricating an e-Fuse structure with improved programmability by using a sidewall process for creating a fuse element feature having a smaller cross-section, i.e. a sub-ground rule, than a typical feature in the interconnect layer. Within the description, "sub-ground rule" means a feature which is smaller than the standard technology minimum features which can be provided in the lithography process which creates other features of the integrated circuit. For example, a nominal technology minimum metal width (ground rule) is 24 nm, a sub-ground rule metal width is <24 nm, for example, 12 nm.

A sub-ground rule dimension allows lower power programming. As an additional advantage, forming the e-Fuse is compatible with existing processing for interconnects in the same level. In some embodiments, no additional masks or processing steps are needed. In embodiments of the invention, the same conducting materials are used in the electronic features and the fuse element of the e-Fuse.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned and may be low dielectric constant (low-k) materials. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than it removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

"Electromigration" is a term applied to the transport of mass in metals when the metals are subjected to high current density. "Electromigration resistance" or "EM-resistance" is a property of a metal which is resistant to this effect.

An e-Fuse is a passive device as compared to active devices such as FET based devices. While the process steps to fabricate one embodiment of the invention are used with a planar metal-oxide-semiconductor field-effect transistor (MOSFET) device, since the e-Fuse is a back-end of line (BEOL) passive device, it works for any of the front-end of line (FEOL) devices. For example, other embodiments described below are incorporated in other devices having source/drain regions and gate structures such as fin field effect transistors (FinFETs).

Electrical fuses (e-Fuses) are used in the semiconductor industry to implement array redundancy, field programmable arrays, analog component trimming circuits, and chip identification circuits. Programming of the prior art electrical fuses typically takes a substantial amount of current, which is undesirable in current technology node devices using low driving current. In addition, programming fuses requires space in a semiconductor chip, as well as power consumption.

Embodiments will be explained below with reference to the accompanying drawings.

E-Fuse technology allows for dynamic real-time reprogramming of computer chips. Although computer logic is generally "hard-coded" onto a chip and cannot be changed after the chip is manufactured, through the use of a set of e-Fuses, a chip manufacturer can allow for the circuits on a chip to change while it is in operation. The technology can provide in-chip performance tuning. If certain sub-systems fail, or are taking too long to respond, or are consuming too much power, the chip can instantly change its behavior by "blowing" an e-Fuse. The process creating opens at selected e-Fuses is also called "programming". E-Fuses are used in the semiconductor industry to implement array redundancy, field programmable arrays, analog component trimming circuits, chip identification circuits and other devices.

The narrow dimension of the fuse element localizes the site where a circuit open is created, i.e. in the fuse element. Increased local current density is obtained at the narrow cross-section of the fuse element, or fuselink, which also elevates the temperature. The narrowing of cross-sectional area increases local current density in the fuse element.

The combination of high current density with the elevated temperature at the fuse element facilitates electromigration of the conductive material at the fuse element. Electrically "blowable" fuses take advantage of the electromigration (EM) effect to open an electrical connection.

Advanced patterning processes, such as self-aligned double patterning (SADP) and self-aligned quadruple patterning (SAQP), use a sidewall process to create a fuse element feature having a smaller cross-section than a typical feature in the interconnect layer, thus increasing the electromigration resistance (EM-resistance) between the adjacent electronic features and the fuse element of the e-Fuse.

Figure 5A:
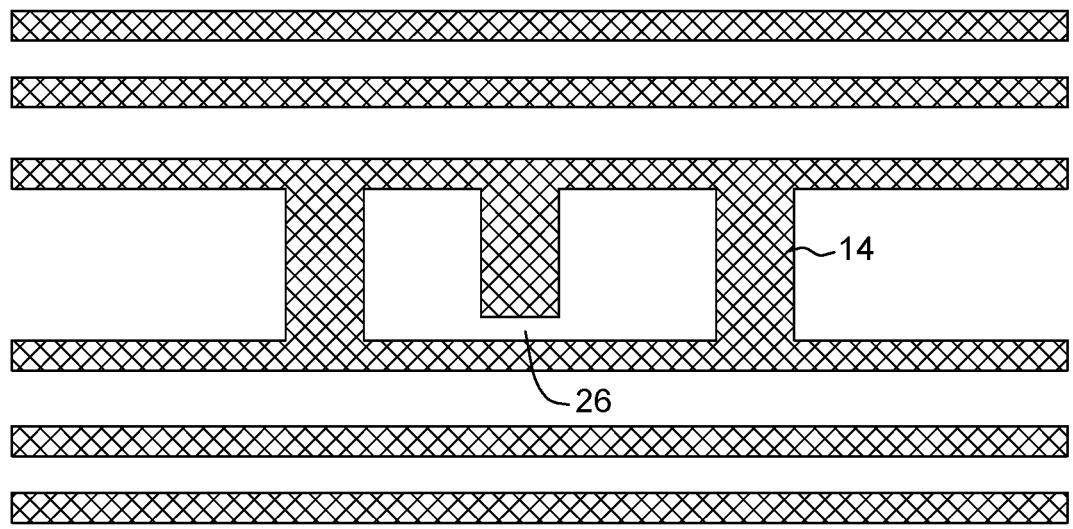
FIGS. 5A and 5B illustrate the substrate in FIGS. 4A and 4B in which the sidewalls have been used as a mask to etch the hard mask layer and then the sidewalls are removed leaving open spaces for the deposition of metal fill including for the sub-ground rule fuse element.
Figure 5B:
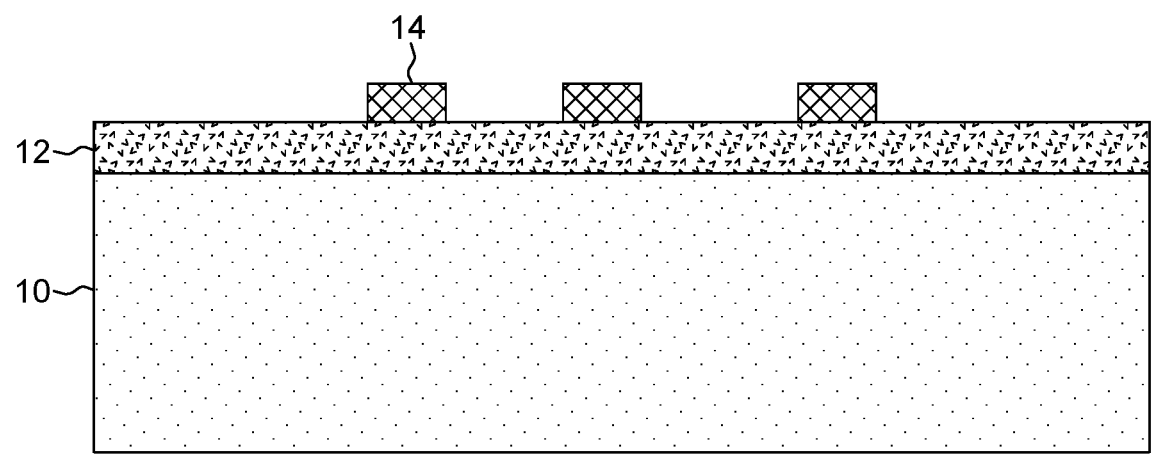
Figure 6A:
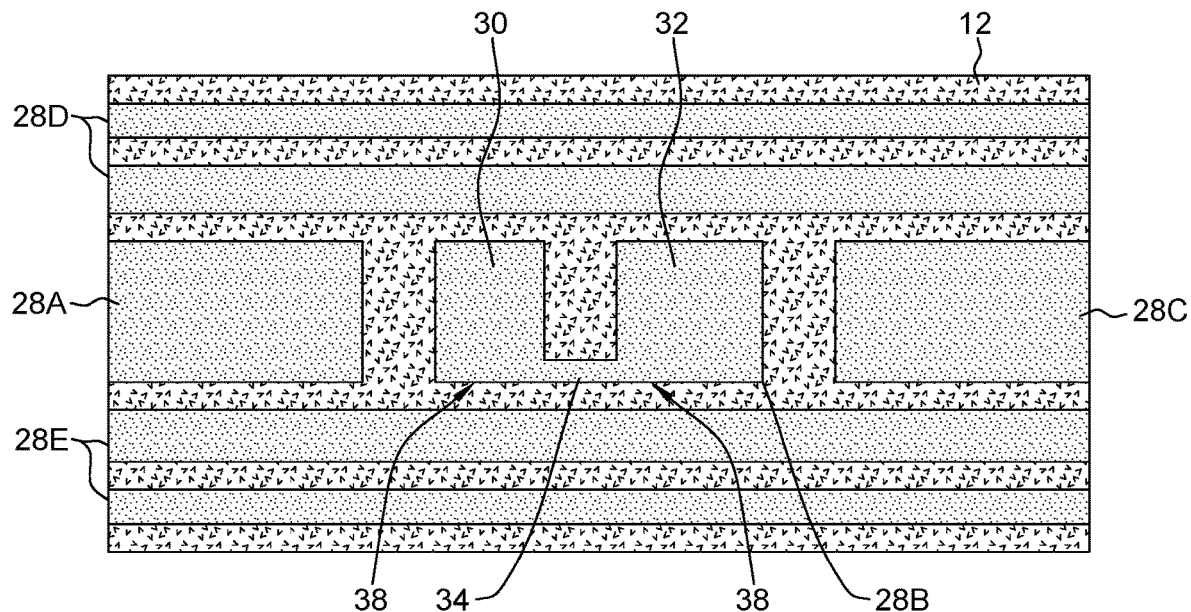
Figure 6B:
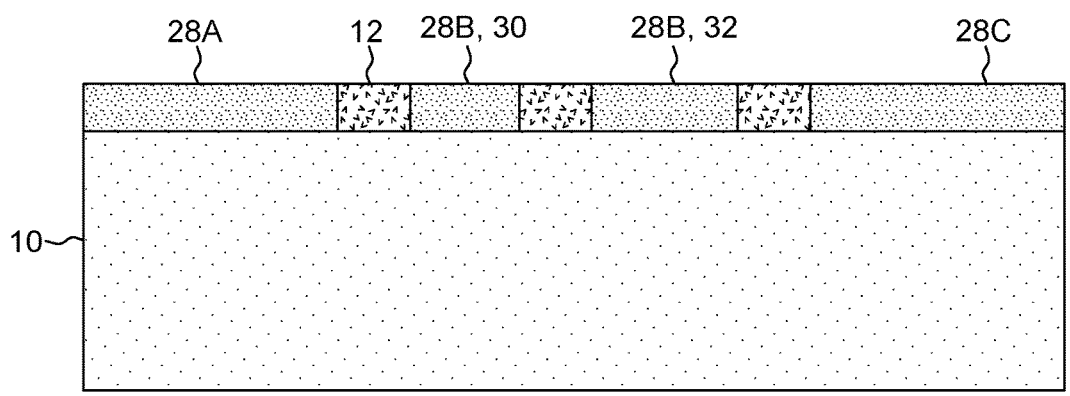
Figure 6C:
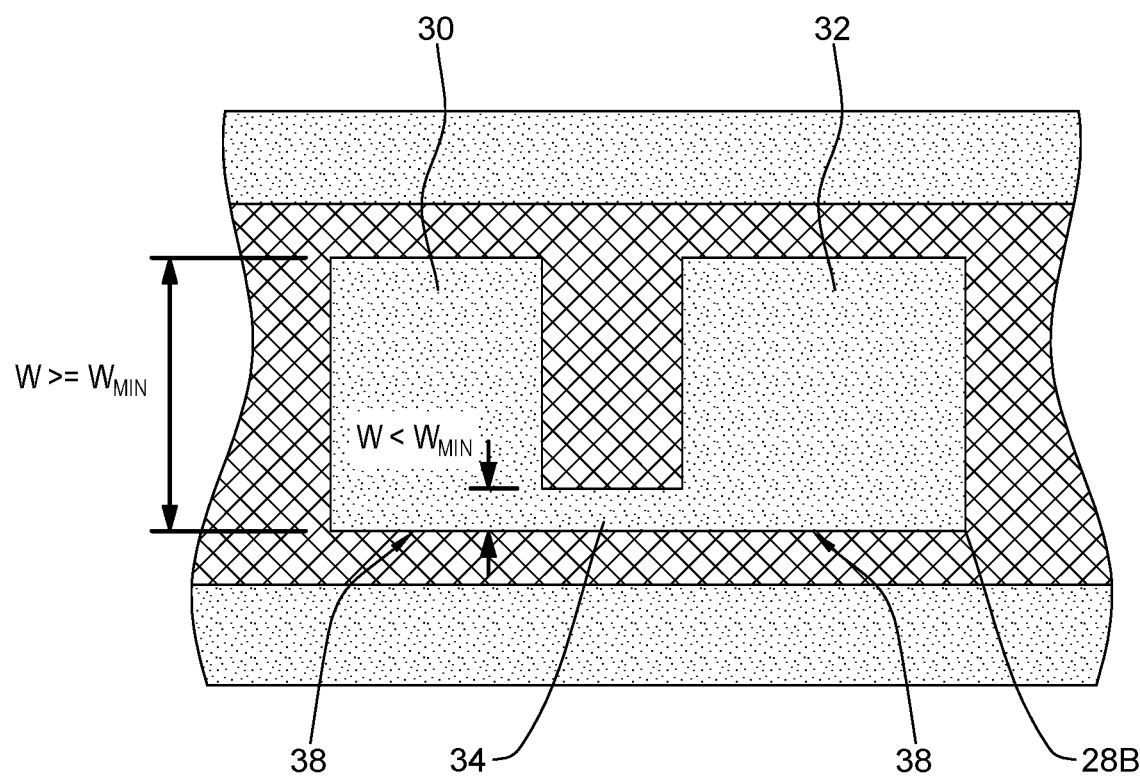

Referring to the Figures in more detail, and particularly referring to FIGS. 1A-6A, 1B to 6B and 6C, there is illustrated an exemplary embodiment of a method of an e-Fuse structure and an e-Fuse structure. The "A" figures are top down views of an e-fuse structure and the "B" figures are cross-sectional views along the B-B line shown only in FIG. 1A. FIG. 6C is an enlarged portion of FIG. 6B.

A self-aligned double patterning (SADP) process may be used in this exemplary embodiment. In the SADP process, a first pattern is used to form the mandrels. An SADP process typically uses two masks, a core mask for patterning the mandrel and a trim (or cut) mask for removing any unnecessary patterns in the mandrel pattern. Since the most critical pattern control in SADP is the thickness of the sidewall spacer rather the alignment of the masks, it has excellent process repeatability Referring to FIGS. 1A and 1B, there is illustrated a semiconductor substrate 10, a dielectric layer 12 in which the electronic features and fuse element will be formed, a hard mask layer 14 and a mandrel layer 16. As best seen in FIG. 1A, the mandrel layer 16 may comprise three mandrels 16A, 16B and 16C. Mandrel 16B, in a subsequent step will be cut into smaller segments using cut masks 18A and 18C. It is noted that cut mask 18B does not completely cut mandrel 16B as this portion of the mandrel 16B is where a fuse element will be formed. A cut mask is a mask having an opening over the portion of the mandrel that is to be cut or removed. In this case, the cut masks 18A, 18B and 18C expose portions of the mandrel 16B that are to be removed. The material used for the mandrels 16A, 16B, 16C will depend on the materials beneath the mandrels to be patterned. For example, in one embodiment, the mandrels are comprised of amorphous silicon (a-Si). The hard mask layer 14 may, for example, be titanium nitride.

Figure 2A:
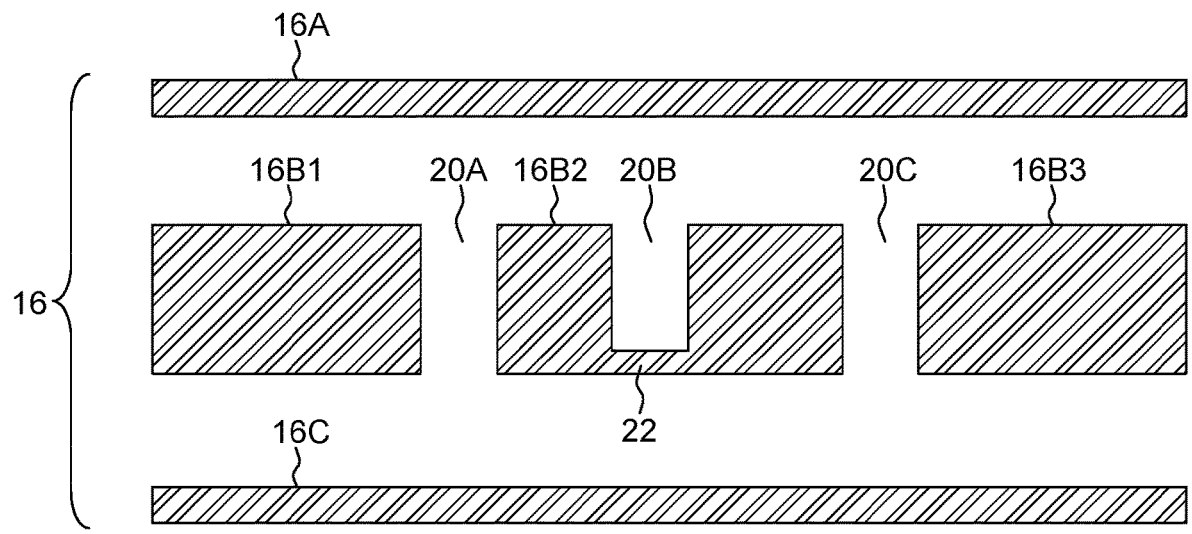
FIGS. 2A and 2B illustrate the substrate in FIGS. 1A and 1B in which the mandrel has been cut including one portion of the mandrel that will form a sub-ground rule fuse element.
Figure 2B:
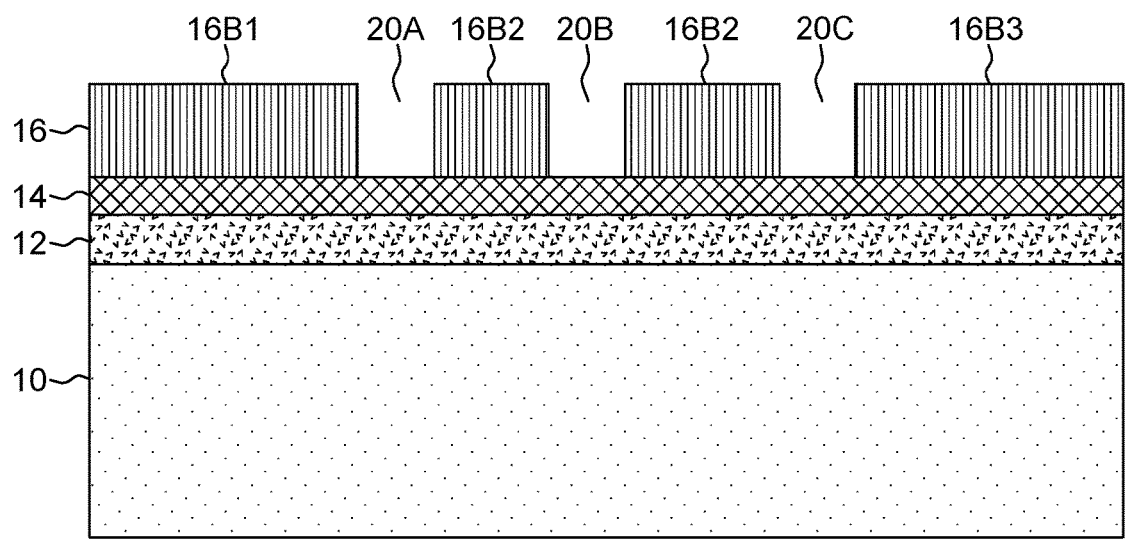

FIGS. 2A and 2B illustrate the structure after a selective mandrel etch process to pattern the mandrel 16B by etching the portions of the mandrel 16B exposed by cut masks 18A, 18B, 18C. Mandrel 16B now has gaps 20A and 20C so that mandrel segments 16B1, 16B2, 16B3 are formed as a result of the patterning process. Mandrel segment 16B2 having gap 20B and portion 22 is where the e-Fuse structure will be formed. The portion 22 of mandrel segment 16B2 where the fuse element will be formed is at sub-ground rule dimension. The other mandrel segments 16B1 and 16B3 as well as mandrels 16A, 16C may be used to form other passive and/or active electronic features which may be at ground rule dimensions and above.

Figure 3A:
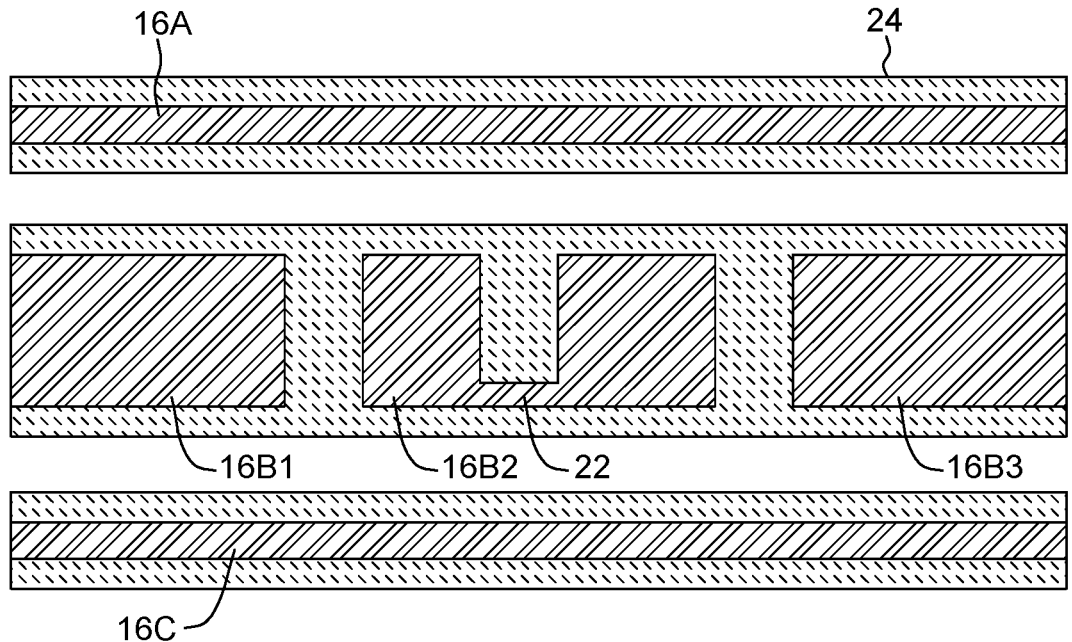
FIGS. 3A and 3B illustrate the substrate in FIGS. 2A and 2B in which a sidewall layer has been deposited over the mandrel and then planarized to form sidewalls on the mandrel including on the portion of the mandrel that will form the sub-ground rule fuse element.
Figure 3B:
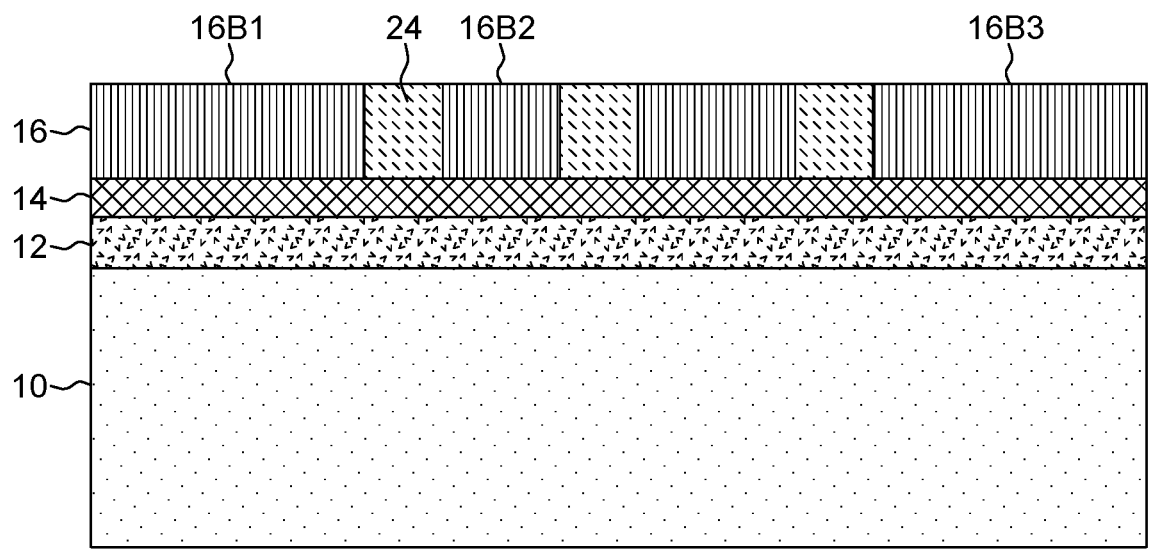

FIGS. 3A and 3B illustrate the structure after a spacer deposition step and an initial directional reactive ion etch (RIE) step have been performed. Spacer (or sidewall) material 24 is shown on the sides of mandrels 16A, 16C and mandrel segments 16B1, 16B2, 16B3. A typical sidewall material for this step is SiO2, however, in other embodiments, other materials may be used.

Initially, the sidewall material 24 is deposited over the mandrels 16A, 16C and mandrel segments 16B1, 16B2, 16B3, covering both the tops and sidewalls of the mandrels 16A, 16C and mandrel segments 16B1, 16B2, 16B3 as well as the horizontal spaces between the mandrels 16A, 16C and mandrel segments 16B1, 16B2, 16B3. The directional RIE step removes the spacer material deposited on the top of the mandrels 16A, 16C and mandrel segments 16B1, 16B2, 16B3 and on the bottom of the white spaces. FIGS. 3A and 3B illustrate the process point after the etch process which removes the excess spacer material. In this process step, only the sidewalls of the sidewall material 24 are left on the mandrels 16A, 16C and mandrel segments 16B1, 16B2, 16B3 after etching.

The material selected for the spacer material 24 should have different etch characteristics than the mandrels. For example, if a-Si (amorphous silicon) is selected for the mandrels, SiO2 is a material which could be used for the sidewall material. In other exemplary embodiments, other materials may be selected. The thicknesses of the mandrel layer and spacer layers are a function of the selectivity of the etch processes to underlying layers. In the case of the spacer layer, it is also a function of the dimensions of the desired features in the integrated circuit as the sidewalls will determine the widths of these features.

Figure 4A:
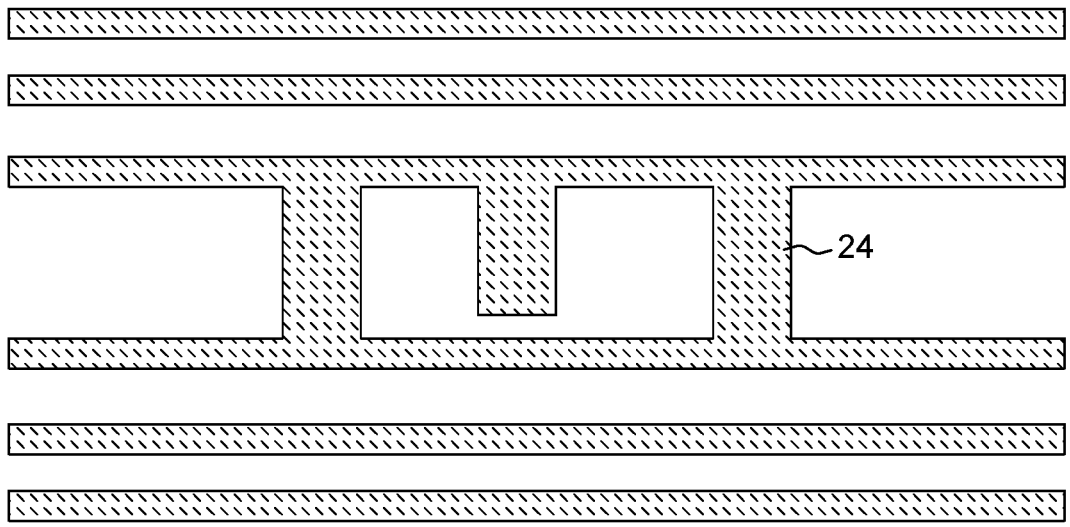
FIGS. 4A and 4B illustrate the substrate in FIGS. 3A and 3B in which the mandrel has been pulled, leaving the sidewalls in place.
Figure 4B:
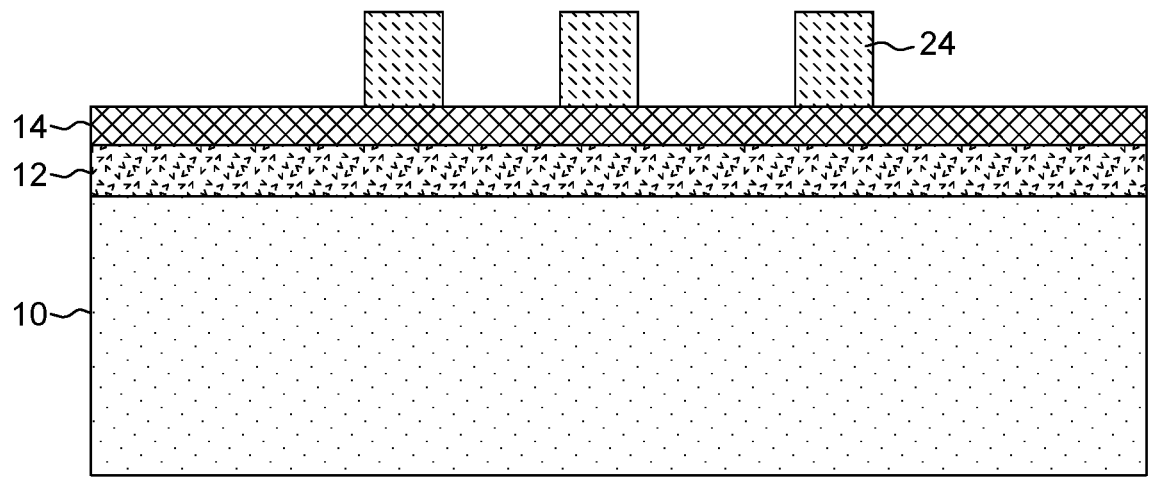

FIGS. 4A and 4B illustrate the structure after a mandrel pull process. In the mandrel pull process, the sacrificial mandrel material is removed, leaving only the sidewall 24 pattern. The mandrel pull process may be done by either a wet etch (e.g., KOH) or RIE process (e.g., by a $CF_4O_2$ plasma) for an amorphous silicon mandrel but the etchant may be varied depending on the materials selected. The white spaces shown in FIG. 4A are where conductive material will be formed in a subsequent step.

Referring to FIGS. 5A and 5B, an etch process is performed to transfer the pattern to the hard mask 14 and subsequent full spacer material 24 removal. In the process which transfers the sidewall pattern to the hard mask 14, so that the hard mask can function as the mask layer for the inter-layer dielectric (ILD) 12 etch, an etch process selective to the hard mask layer (as compared to the sidewall material) is used. The hard mask layer is selected to have different etch properties as compared to the ILD layer 12. For example, in preferred embodiments, the hard mask layer is made of TiN, SiN, SiN/SiO2, SiBCN or SiOCN, in either a single or multi-layer mask or any combination thereof. A preferred embodiment uses TiN as the hard mask. After the sidewall pattern is transferred to the hard mask, the sidewall material 24 may be removed by a wet etch or RIE process.

Conventional deposition processes such as spin on, an atomic layer deposition (ALD), chemical vapor deposition (CVD) or plasma enhanced chemical vapor deposition (PECVD), are used to deposit the mandrel layer 16, sidewall material 24 and hard mask layer 14. As best shown in FIG. 5A, the white spaces, devoid of the hard mask 14, indicate the future positions of the conductive electronic features. In particular, white space 26 is the future location of the fuse element.

Finally, the ILD layer 12 is etched to the appropriate depth for the e-Fuse device as well as the other electronic features in this layer. The ILD layer 12 may be any suitable dielectric material such as, for example, low K dielectric materials, SiC, Si4NH3, SiO2, a carbon doped oxide, a nitrogen and hydrogen doped silicon carbide SiC(N,H) or multilayers thereof.

Referring now to FIGS. 6A and 6B, after etching of the ILD layer 12, there is metal fill to form conductive electronic features 28A-28E and a chemical mechanical polishing step to remove the hard mask 14. The ILD layer 12 appears between the electronic features 28A-28E. The conductive electronic features 28A-28E, again may be active and/or passive components and may include interconnections between these components, and may be fabricated from a conductive material, for example, a metal such as W, Cu, Al, Co, Ru or alloys thereof. Barrier layers additionally may be conventionally deposited. Conventional deposition processes such as an atomic layer deposition (ALD), chemical vapor deposition (CVD), plasma enhanced chemical vapor deposition (PECVD), electroless plating may be used to deposit the metals or alloys in the exemplary embodiments.

The e-Fuse device, illustrated as conductive electronic feature 28B in FIG. 6A may be comprised of a first electronic feature 30, a second electronic feature 32 and the fuse element 34 connecting the first electronic feature 30 and the second electronic feature 32. The first electronic feature 30, the second electronic feature 32 and fuse element 34 are connected in such a way that the fuse element 34 is aligned with the edges 38 of the first electronic feature 30 and the second electronic feature 32. The first electronic feature 30, second electronic feature 32 and fuse element 34 are contiguous in the sense that first electronic feature 30, second electronic feature 32 and fuse element 34 are in close contact and form a single unit. More particularly, the fuse element 34 directly contacts the first electronic feature 30 and the second electronic feature 32.

The fuse element 34 is a "sub-ground rule" element and is thus thinner than the technology defined standard minimum width can produce. As discussed herein, the cross-section of the fuse element is smaller than that of the first electronic feature 30 and the second electronic feature 32 and so the open of the e-Fuse is localized to the fuse element 34 when the programming voltage or current is applied to the device.

FIG. 6C is an enlargement of the e-Fuse device. In the exemplary embodiments, the width, "W", of the first electronic feature 30 and the second electronic feature 32 is 1× or greater than the ground rule dimension (i.e., W>=Wmin where "Wmin" is the width of the ground rule), while the width of the fuse element 34 is smaller than the ground rule, i.e. a fractional multiplier of the ground rule. As shown in FIG. 6C, the width "W" of the fuse element 34 is less than "Wmin". For an SADP process, the minimum feature is defined by the spacer 24 to overcome the lithography limitations.

Figure 7A:
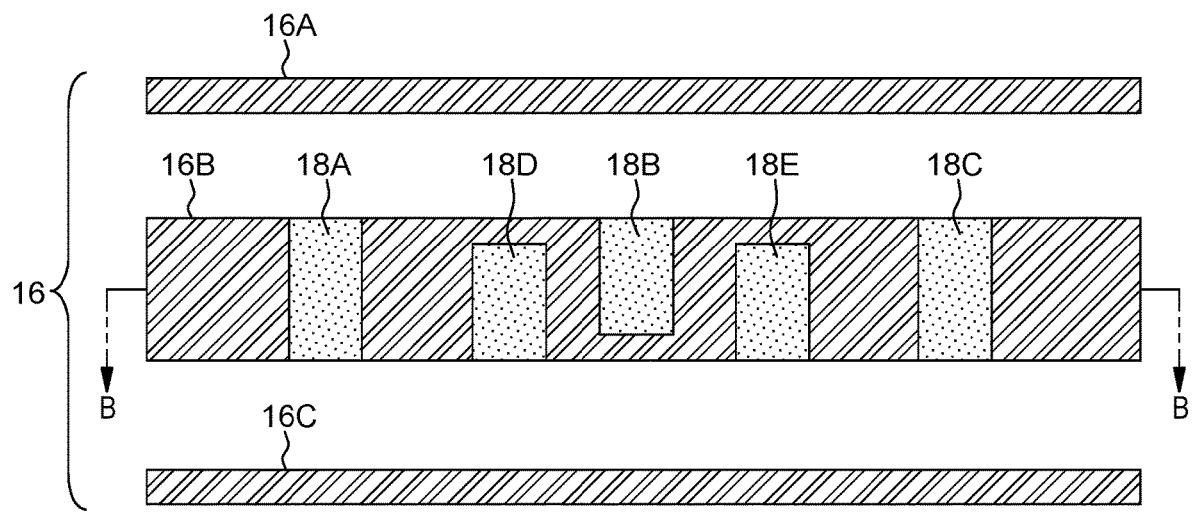
Figure 11A:
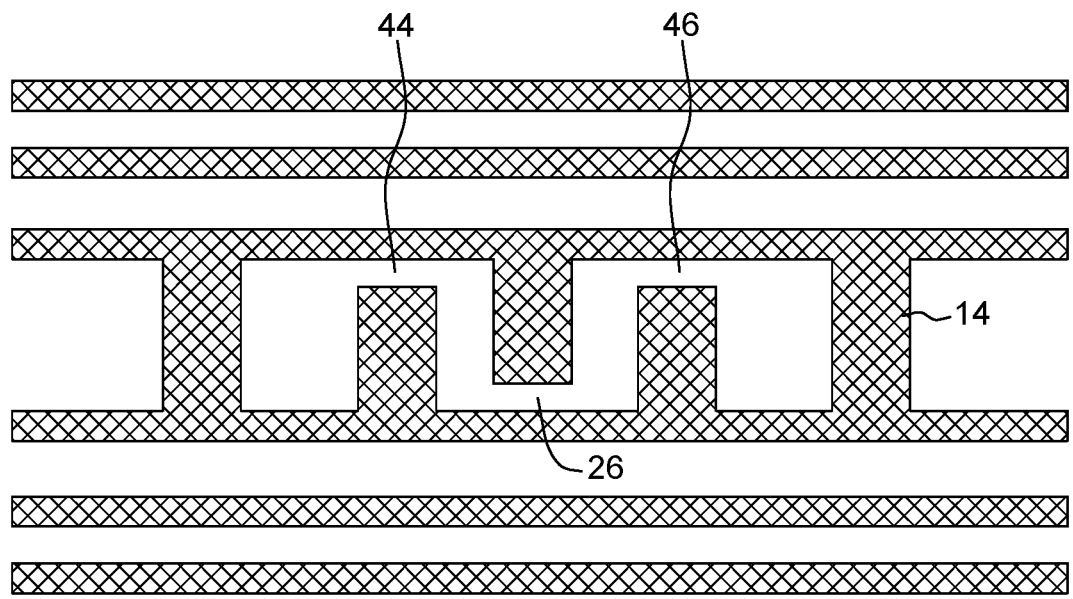
FIGS. 11A and 11B illustrate the substrate in FIGS. 10A and 10B in which the sidewalls have been used as a mask to etch the hard mask layer and then the sidewalls are removed leaving open spaces for the deposition of metal fill including for the sub-ground rule fuse element and the sub-ground rule heat blocking end links.
Figure 11B:
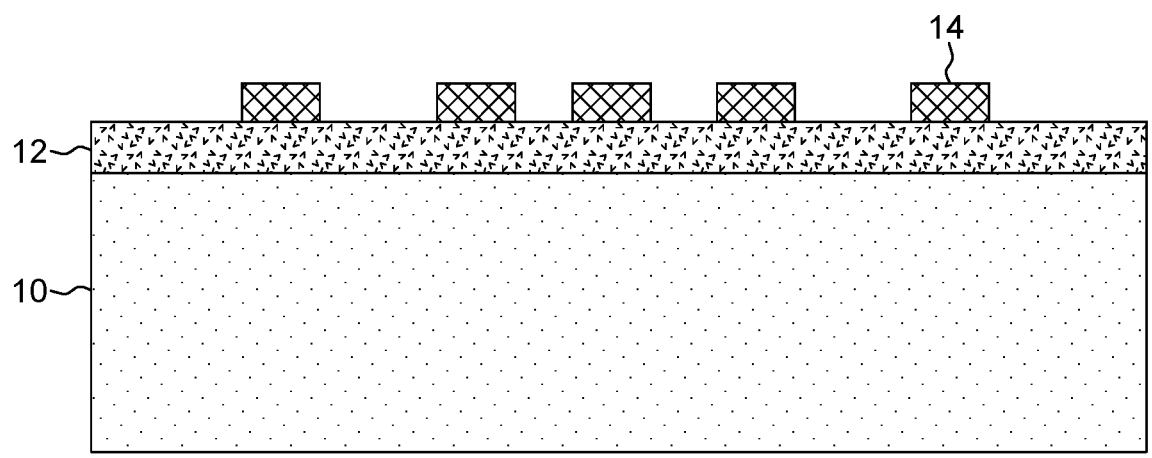
Figure 12A:
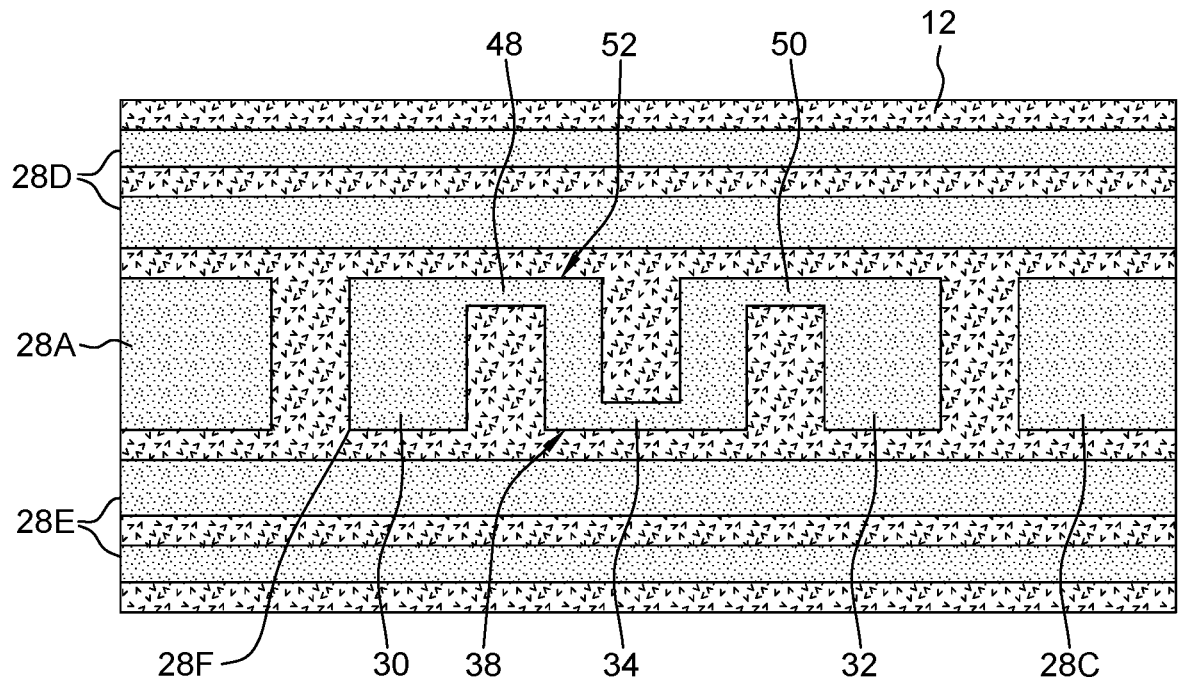
Figure 12B:
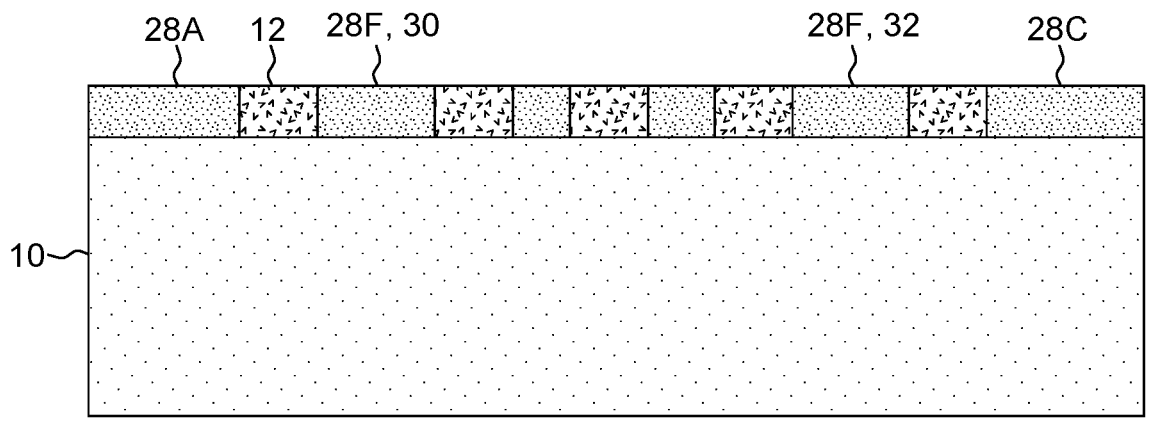
Figure 12C:
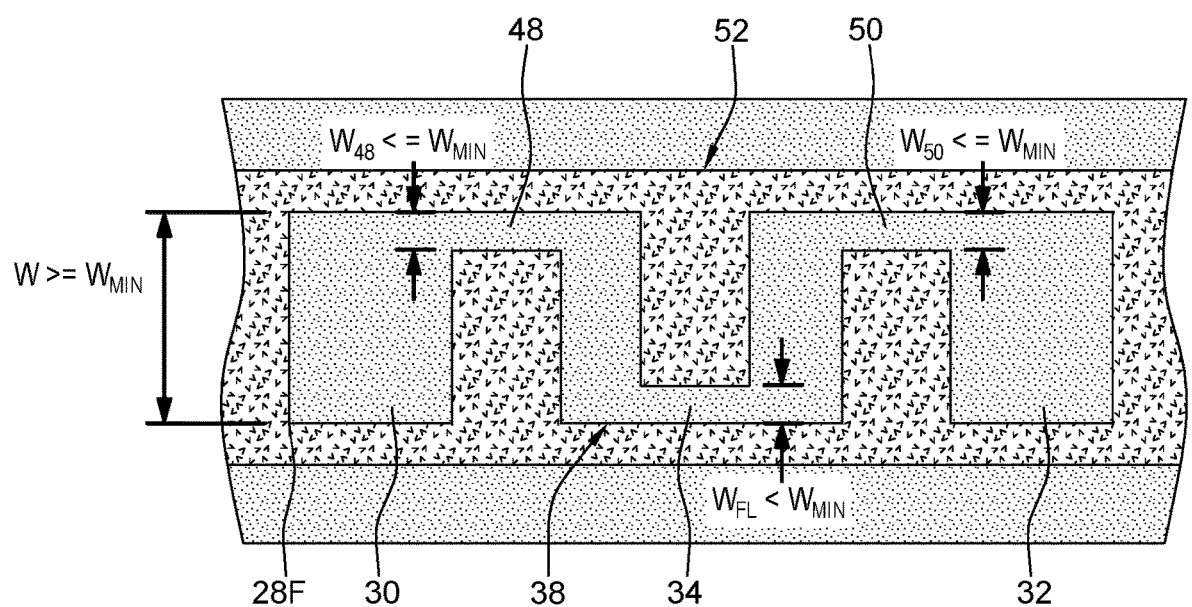

Referring now FIGS. 7A-12A, 7B to 12B and 12C, there is illustrated another exemplary embodiment of a method of an e-Fuse structure and an e-Fuse structure. The "A" figures are top down views of an e-fuse structure and the "B" figures are cross-sectional views along the B-B line shown only in FIG. 7A and FIG. 12C is an enlarged portion of FIG. 12B. This exemplary embodiment has common features with the previous exemplary embodiment in FIGS. 1A-6A 1B-6B and 6C and like features will have the same reference numbers.

A self-aligned double patterning (SADP) process may be used in this exemplary embodiment.

Figure 7B:
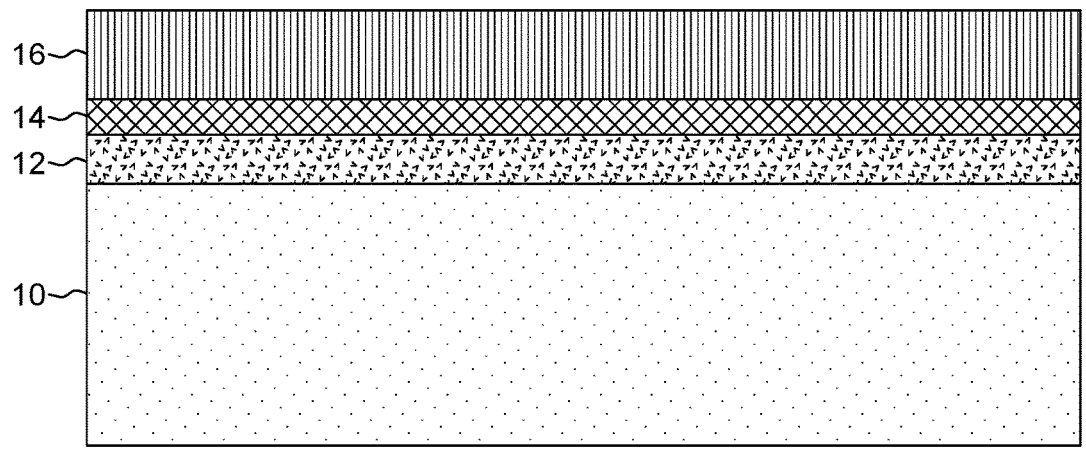

Referring to FIGS. 7A and 7B, there is illustrated a semiconductor substrate 10, a dielectric layer 12 in which the electronic features and fuse element will be formed, a hard mask layer 14 and a mandrel layer 16. As best seen in FIG. 7A, the mandrel layer 16 may comprise three mandrels 16A, 16B and 16C. Mandrel 16B, in a subsequent step will be cut into smaller segments using cut masks 18A and 18C. It is noted that cut masks 18B, 18D and 18E do not completely cut mandrel 16B as this portion of the mandrel 16B is where a fuse element and two heat blocking end links will be formed.

Figure 8A:
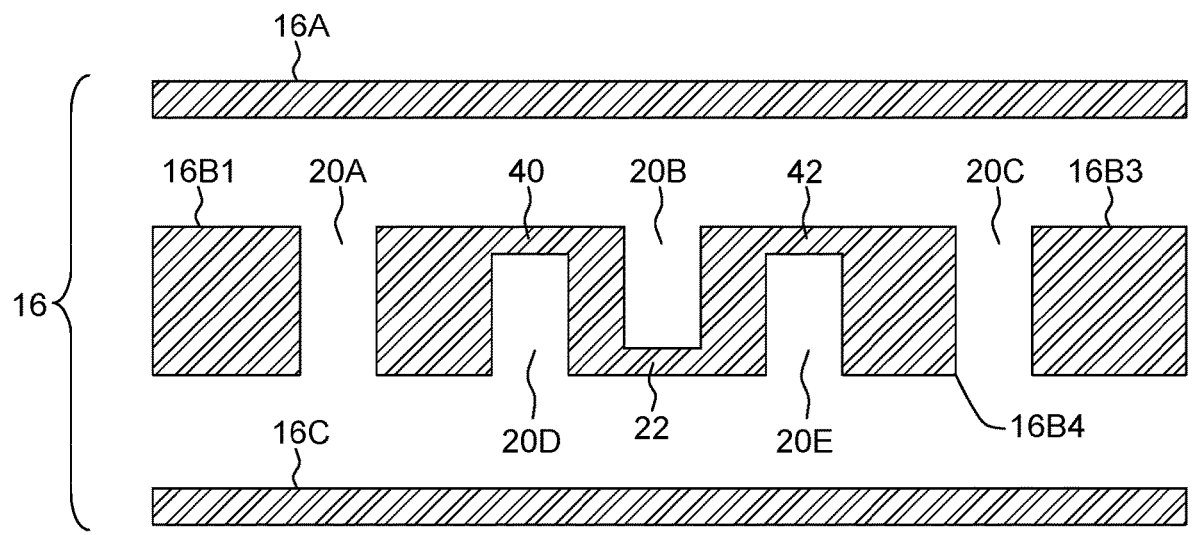
FIGS. 8A and 8B illustrate the substrate in FIGS. 7A and 7B in which the mandrel has been cut including one portion of the mandrel that will form a sub-ground rule fuse element and two portions for sub-ground rule heat blocking end links.
Figure 8B:
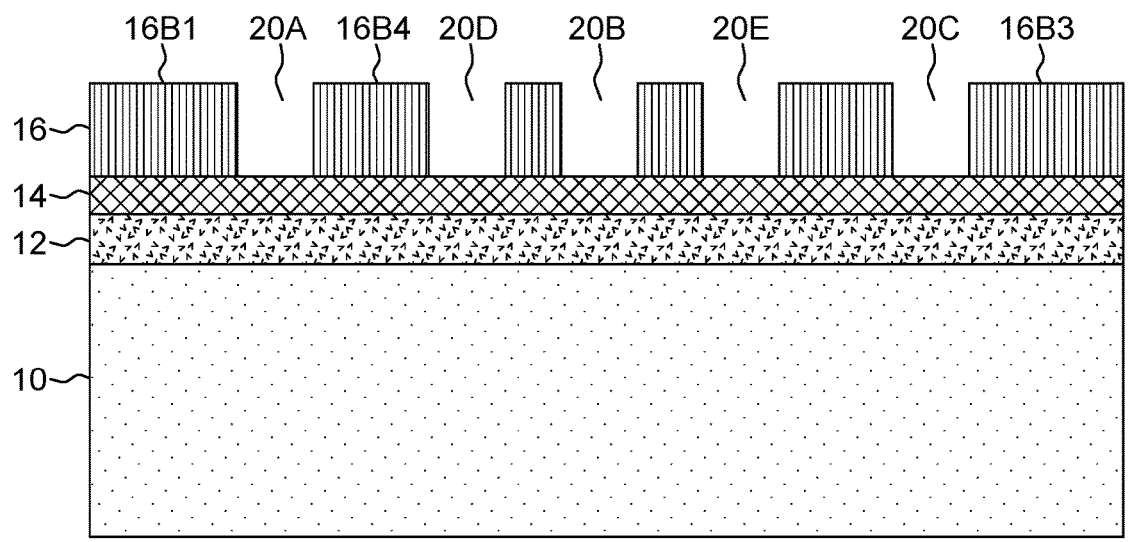

FIGS. 8A and 8B illustrate the structure after a mandrel etch process to pattern the mandrel 16B by etching the portions of the mandrel 16B exposed by cut masks 20A, 20B, 20C, 20D, 20E. Mandrel 16B now has gaps 20A and 20C so that mandrel segments 16B1, 16B3, 16B4 are formed as a result of the patterning process. Mandrel segment 16B4 is different from mandrel segment 16B2 in the previous exemplary embodiment due to the additional gaps for the two heat blocking end links. Mandrel segment 16B4 is where the e-Fuse structure will be formed. Mandrel segment 16B4 additionally has gaps 20B, 20D and 20E and portions 22, 40 and 42 where the fuse element and heat blocking end links, respectively, will be formed. The portions 22, 40 and 42 of mandrel segment 16B4 where the fuse element and heat blocking end links, respectively, will be formed are at sub-ground rule dimension. The other mandrel segments 16B1 and 16B3 as well as mandrels 16A, 16C may be used to form other passive and/or active electronic features which may be at ground rule dimensions and above.

Figure 9A:
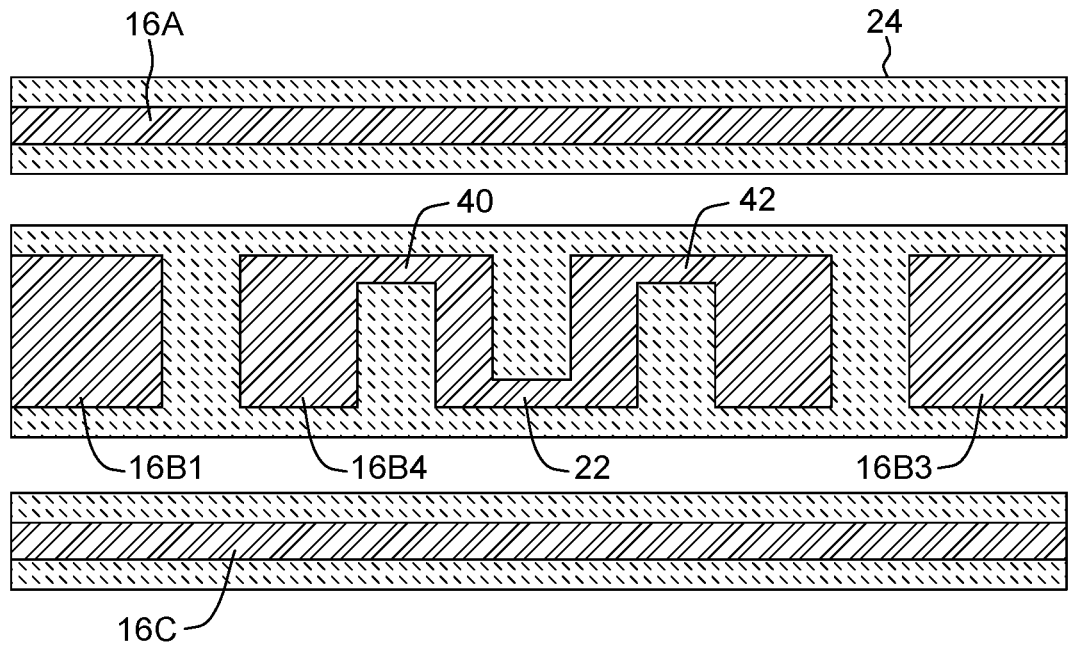
FIGS. 9A and 9B illustrate the substrate in FIGS. 8A and 8B in which a sidewall layer has been deposited over the mandrel and then planarized to form sidewalls on the mandrel including on the portions of the mandrel that will form the sub-ground rule fuse element and the sub-ground rule heat blocking end links.
Figure 9B:
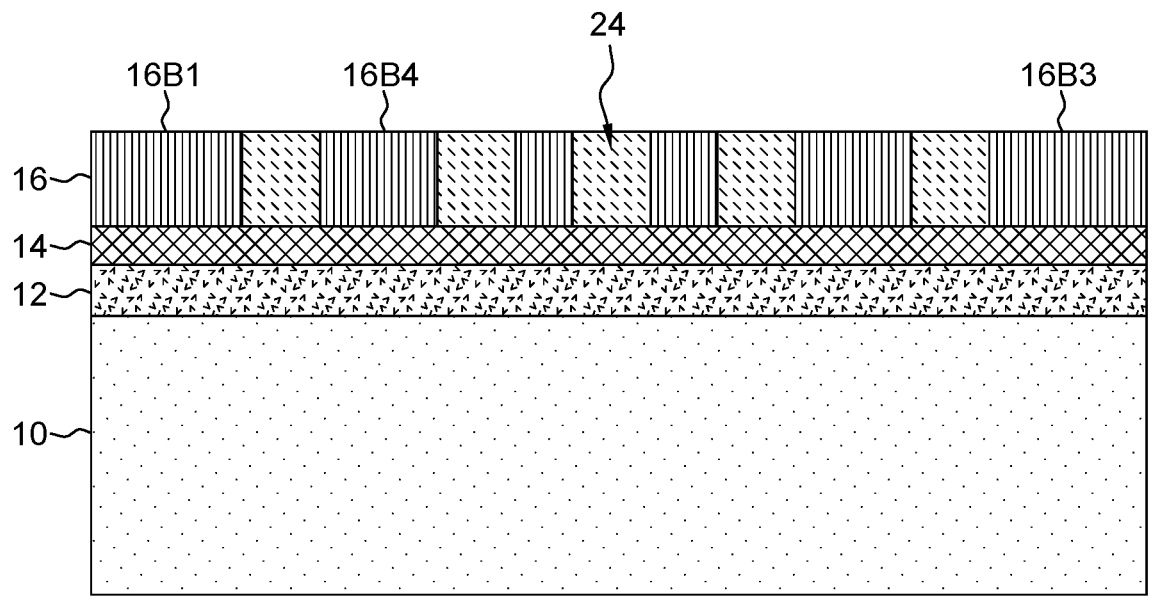

FIGS. 9A and 9B illustrate the structure after a spacer deposition step and an initial directional reactive ion etch (RIE) step have been performed. Spacer (or sidewall) material 24 is shown on the sides of mandrels 16A, 16C and mandrel segments 16B1, 16B4, 16B3. Initially, the sidewall material 24 is deposited over the mandrels 16A, 16C and mandrel segments 16B1, 16B4, 16B3, covering both the tops and sidewalls of the mandrels 16A, 16C and mandrel segments 16B1, 16B4, 16B3 as well as the horizontal spaces between the mandrels 16A, 16C and mandrel segments

16B1, 16B4, 16B3. The directional RIE step removes the spacer material deposited on the top of the mandrels 16A, 16C and mandrel segments 16B1, 16B4, 16B3 and on the bottom of the white spaces. FIGS. 9A and 9B illustrate the process point after the etch process which removes the excess spacer material 24. In this process step, only the sidewalls of the sidewall material 24 are left on the mandrels 16A, 16C and mandrel segments 16B1, 16B4, 16B3 after etching.

Figure 10A:
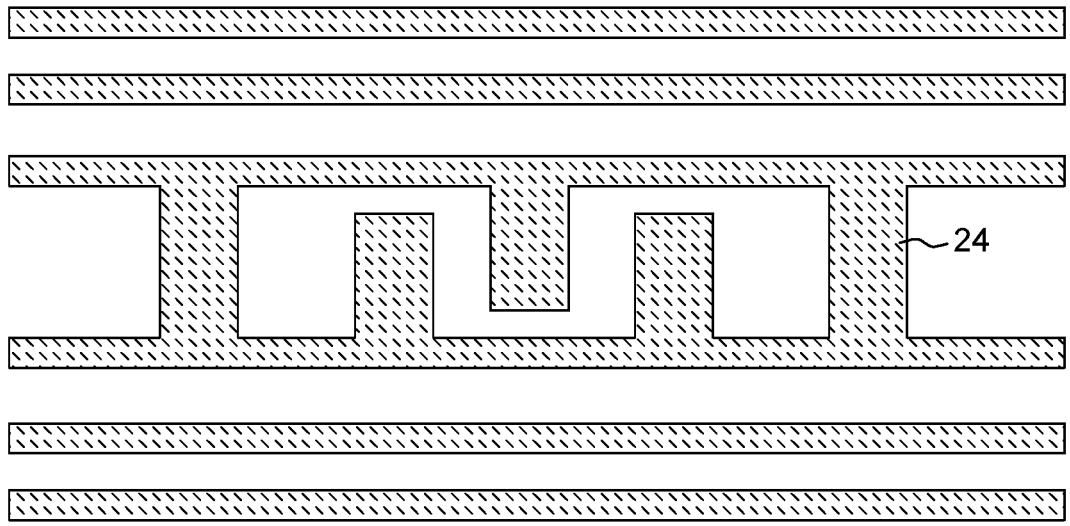
FIGS. 10A and 10B illustrate the substrate in FIGS. 9A and 9B in which the mandrel has been pulled, leaving the sidewalls in place.
Figure 10B:
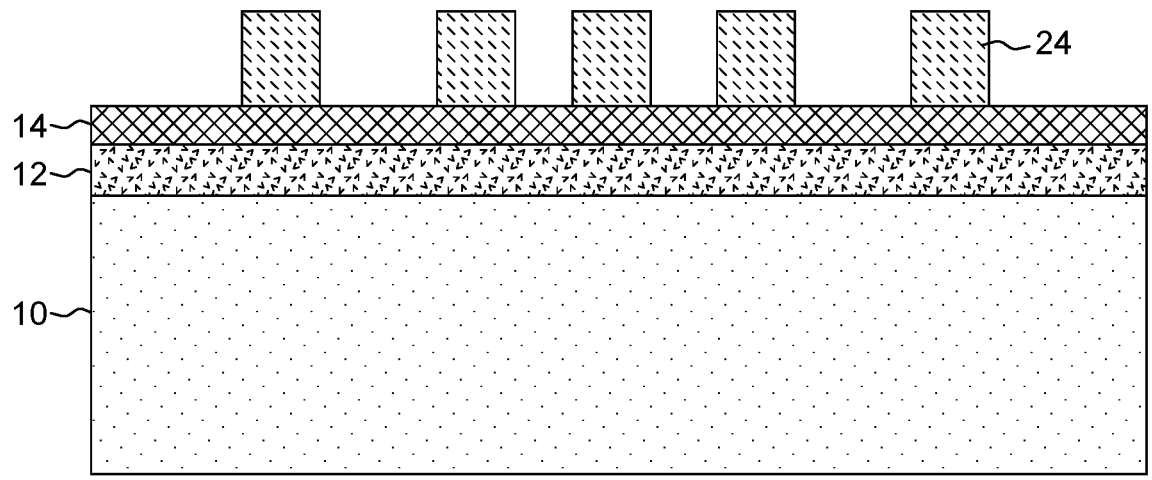

FIGS. 10A and 10B illustrate the structure after the mandrel pull process. In the mandrel pull process, the sacrificial mandrel material is removed, leaving only the sidewall 24 pattern. The white spaces shown in FIG. 10A are where conductive material will be formed in a subsequent step.

Referring to FIGS. 11A and 11B, an etch process is performed to transfer the sidewall pattern to the hard mask 14 and subsequent full spacer material 24 removal. After the sidewall pattern is transferred to the hard mask 14, the sidewall 24 pattern may be removed by a wet etch or RIE process.

As best shown in FIG. 11A, the white spaces, devoid of the hard mask 14, indicate the future positions of the conductive electronic features. In particular, white space 26 is the future location of the fuse element while white spaces 44, 46 are the future locations for the heat blocking end links.

Finally, the ILD layer 12 is etched to the appropriate depth for the e-Fuse device as well as the other electronic features in this layer.

Referring now to FIGS. 12A and 12B, after etching of the ILD layer 12, there is metal fill to form conductive electronic features 28A and 28C-28F and a chemical mechanical polishing step to remove the hard mask 14. Former feature 28B in the previous exemplary embodiment is now shown as electronic feature 28F. The ILD layer 12 appears between the electronic features 28A and 28C-28F. The conductive electronic features 28A and 28C-28F again may be active and/or passive components and may include interconnections between these components.

The e-Fuse device, illustrated as conductive electronic feature 28F in FIG. 12A may be comprised of a first electronic feature 30, a second electronic feature 32, the fuse element 34, a first heat blocking end link 48 connecting the first electronic feature 30 and the fuse element 34, and a second heat blocking end link 50 connecting the fuse element 34 and the second electronic feature 32. The first electronic feature 30, the second electronic feature 32 and fuse element 34 are connected in such a way that the fuse element 34 is aligned with first edges 38 of the first electronic feature 30 and the second electronic feature 32 while the first heat blocking end link 48 and the second heat blocking end link 50 are aligned with second edges 52 of the first electronic feature 30 and the second electronic feature 32. The first electronic feature 30, second electronic feature 32, fuse element 34, first heat blocking end link 48 and second heat blocking end link 50 are contiguous in the sense that first electronic feature 30, second electronic feature 32, fuse element 34, first heat blocking end link 48 and second heat blocking end link 50 are in close contact and form a single unit. More particularly, the first heat blocking end link 48 directly contacts the first electronic feature 30 while the second heat blocking end link 50 directly contacts the second electronic feature 32.

The fuse element 34, first heat blocking end link 48 and second heat blocking end link 50 are all "sub-ground rule" elements and thus thinner than the technology defined standard minimum width can produce. As discussed herein, the cross-section of the fuse element 34, first heat blocking end link 48 and second heat blocking end link 50 are smaller than that of the first electronic feature 30 and the second electronic feature 32 and so the open of the e-Fuse is localized to the fuse element 34 when the programming voltage is applied to the device.

During the programming operation, there is localized heating at the fuse element 34, first heat blocking end link 48 and second heat blocking end link 50. The first heat blocking end link 48 and second heat blocking end link 50 prevent heat loss from the fuse element 34 which results in more efficient e-Fuse programming with less current. The first heat blocking end link 48 and second heat blocking end link 50 should be wider than the fuse element 34 to ensure that the programming will be localized to fuse element 34. FIG. 12C is an enlargement of the e-Fuse device. In the exemplary embodiments, the width, "W", of the first electronic feature 30 and the second electronic feature 32 is 1× or greater than the ground rule dimension (i.e., W>=Wmin where "Wmin" is the width of the ground rule), while the width of the fuse element 34, "Wfl" is smaller than the ground rule (ie. Wfl<Wmin) and the first heat blocking end link 48, "W48", and second heat blocking end link 50, "W50", are less than or equal to the ground rule (i.e., W48, W50<=Wmin). To ensure that the fuse programming is localized in the fuse element 34, it is preferred that W48 and W50 are greater than Wfl and most preferably that W48 and W50 are greater than Wfl by at least 10 percent. For an SADP process, the minimum feature is defined by the spacer 24 to overcome the lithography limitations.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

The invention claimed is:

1. A method for making an e-Fuse device comprising:
   forming a mandrel structure over a dielectric;
   patterning the mandrel structure to include a first portion, a second portion and a third portion connecting the first portion and the second portion, the third portion having a dimension that is less than a minimum ground rule;
   forming a sidewall layer over the mandrel structure so that sidewalls are formed in a sidewall pattern on sidewalls of the mandrel structure;
   removing the mandrel structure and, in a patterning process, using the sidewall pattern to etch the dielectric to form a trench structure comprising a first electronic feature replacing the first portion of the mandrel structure and having a width at least as great as a ground rule of the patterning process for the first electronic feature, a second electronic feature replacing the second portion of the mandrel structure having a width at least as great as a ground rule of the patterning process for the second electronic feature and a fuse element trench having a width less than the minimum ground rule replacing the third portion of the mandrel structure; and
   filling the trench structure with conductive material to form the first and second electronic features and a fuse element having a width less than the minimum ground rule such that the fuse element directly contacts the first electronic feature and the second electronic feature to form the e-Fuse device.

2. The method of claim 1 further comprising forming a hard mask between the dielectric and the mandrel structure and wherein removing the mandrel structure and using the sidewall pattern to etch the dielectric includes using the sidewall pattern to etch the hard mask which is used to etch the dielectric.

3. The method of claim 1 wherein the patterning process includes using a cut mask to pattern the mandrel structure to form the third portion.

4. The method of claim 1 wherein the third portion is contiguous with the first portion and the second portion.

5. The method of claim 1 wherein the fuse element directly contacts the first electronic feature and the second electronic feature so that the first electronic feature, fuse element and second electronic feature form an electronic circuit.

6. The method of claim 1 wherein providing a mandrel structure further comprises including a fourth portion between the first portion and the third portion and a fifth portion between second portion and the third portion, the fourth portion and the fifth portion each having a dimension that is less than a minimum ground rule;
   wherein removing the mandrel structure and using the sidewall pattern to etch the dielectric further comprising a first heat blocking link trench having a width less than the minimum ground rule replacing the fourth portion and a second heat blocking link trench having a width less than the minimum ground rule replacing the fifth portion; and
   wherein filling the trench structure further comprising filling the first heat blocking link trench and the second heat blocking link trench with the conductive material to form a first heat blocking link and a second heat blocking link each having a width less than or equal to the minimum ground rule.

7. The method of claim 6 wherein the width of the first heat blocking link and the width of the second heat blocking link are greater than the width of the fuse element.

8. The method of claim 6 wherein the width of the first heat blocking link and the width of the second heat blocking link are greater than the width of the fuse element by at least ten percent.

9. The method of claim 6 wherein the patterning process includes using a cut mask to pattern the mandrel structure to form the fourth and fifth portions.

10. The method of claim 6 wherein the fourth portion is contiguous with the first portion and the third portion and the fifth portion is contiguous with the second portion and the third portion.

11. The method of claim 6 further comprising programming the fuse element such that the first and second heat blocking links preventing heat loss from the fuse element.

* * * * *